United States Patent
Arai et al.

(10) Patent No.: US 9,060,431 B2
(45) Date of Patent: *Jun. 16, 2015

(54) LIQUID CRYSTAL POLYMER COPPER-CLAD LAMINATE AND COPPER FOIL USED FOR SAID LAMINATE

(75) Inventors: Hideta Arai, Hitashi (JP); Kengo Kaminaga, Hitashi (JP); Atsushi Miki, Hitashi (JP); Ryo Fukuchi, Hitashi (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/824,478
(22) PCT Filed: Mar. 12, 2012
(86) PCT No.: PCT/JP2012/056318
§ 371 (c)(1), (2), (4) Date: May 31, 2013
(87) PCT Pub. No.: WO2012/169249
PCT Pub. Date: Dec. 13, 2012

(65) Prior Publication Data
US 2014/0093743 A1   Apr. 3, 2014

(30) Foreign Application Priority Data
Jun. 7, 2011 (JP) ................................. 2011-127772

(51) Int. Cl.
*B32B 5/20* (2006.01)
*H05K 1/02* (2006.01)
(Continued)

(52) U.S. Cl.
CPC ....... *H05K 1/0274* (2013.01); *Y10T 428/12049* (2015.01); *C25D 7/0614* (2013.01);
(Continued)

(58) Field of Classification Search
CPC ..... A01B 12/006; H05K 1/0274; H05K 3/384
USPC ......... 428/546, 548, 612, 626, 648, 658, 674, 428/675, 687
See application file for complete search history.

(56) References Cited

U.S. PATENT DOCUMENTS

| 4,014,756 A | 3/1977 | Fromson |
| 4,159,231 A * | 6/1979 | Smith et al. ................... 205/107 |

(Continued)

FOREIGN PATENT DOCUMENTS

| GB | 1558919 | 1/1980 |
| JP | 04-096395 A | 3/1992 |

(Continued)

OTHER PUBLICATIONS

Office Action from U.S. Appl. No. 13/635,147 dated Aug. 7, 2014.
(Continued)

*Primary Examiner* — Cathy Lam
(74) *Attorney, Agent, or Firm* — Drinker Biddle & Reath LLP

(57) ABSTRACT

Provided is a copper-clad laminate obtainable by bonding a copper foil on which roughening treatment including copper-cobalt-nickel alloy plating is performed and a liquid crystal polymer to each other, wherein the copper-clad laminate is free from a roughening particle residue on a surface of the liquid crystal polymer resin after copper foil circuit etching. The copper-clad laminate obtainable by bonding a copper foil and a liquid crystal polymer to each other, wherein the copper foil includes a copper primary particle layer formed on a surface bonded to the liquid crystal polymer and a secondary particle layer formed on the primary particle layer and made from a ternary alloy including copper, cobalt, and nickel; the primary particle layer has an average particle size of 0.25 to 0.45 μm; and the secondary particle layer has an average particle size of 0.05 to 0.25 μm.

34 Claims, 5 Drawing Sheets

(51) Int. Cl.
*C25D 7/06* (2006.01)
*H05K 3/38* (2006.01)
*C25D 5/10* (2006.01)
*C25D 5/48* (2006.01)
*H05K 1/09* (2006.01)
*C25D 3/38* (2006.01)
*C25D 3/58* (2006.01)
*C25D 5/12* (2006.01)
*C25D 11/38* (2006.01)

(52) U.S. Cl.
CPC ............. *H05K 1/09* (2013.01); *H05K 3/384* (2013.01); *H05K 2201/0141* (2013.01); *H05K 2201/0355* (2013.01); *C25D 3/38* (2013.01); *C25D 3/58* (2013.01); *C25D 5/10* (2013.01); *C25D 5/12* (2013.01); *C25D 5/48* (2013.01); *C25D 11/38* (2013.01)

(56) References Cited

U.S. PATENT DOCUMENTS

| | | | |
|---|---|---|---|
| 4,586,989 A | | 5/1986 | Rasmussen |
| 4,640,747 A | * | 2/1987 | Ueno et al. ............ 156/151 |
| 5,019,222 A | * | 5/1991 | Hino et al. ............ 205/152 |
| 5,366,814 A | | 11/1994 | Yamanishi et al. |
| 5,370,784 A | | 12/1994 | Kammel et al. |
| 5,458,746 A | * | 10/1995 | Burgess et al. ............ 205/77 |
| 5,552,234 A | * | 9/1996 | Kawasumi ............ 428/633 |
| 6,939,622 B2 | | 9/2005 | Yoshihara et al. ............ 428/675 |
| 6,969,557 B2 | * | 11/2005 | Matsuda et al. ............ 428/546 |
| 7,381,475 B2 | * | 6/2008 | Suzuki ............ 428/553 |
| 7,651,783 B2 | * | 1/2010 | Tsuchida et al. ............ 428/626 |
| 8,449,987 B2 | | 5/2013 | Kobayashi et al. |
| 8,524,378 B2 | | 9/2013 | Arai et al. |
| 8,642,893 B2 | | 2/2014 | Higuchi |
| 2004/0161627 A1 | | 8/2004 | Yoshihara et al. |
| 2004/0191560 A1 | | 9/2004 | Matsuda et al. |
| 2005/0175826 A1 | | 8/2005 | Suzuki |
| 2009/0208762 A1 | | 8/2009 | Akase |
| 2012/0107637 A1 | | 5/2012 | Akase |

FOREIGN PATENT DOCUMENTS

| | | |
|---|---|---|
| JP | 6054831 A | 3/1994 |
| JP | 6-50794 B2 | 6/1994 |
| JP | 9087889 A | 3/1997 |
| JP | 10-018075 A | 1/1998 |
| JP | 1018075 A | 1/1998 |
| JP | 10-341066 A | 12/1998 |
| JP | 2849059 B2 | 1/1999 |
| JP | 11-135952 A | 5/1999 |
| JP | 11-340595 A | 12/1999 |
| JP | 3295308 B2 | 6/2002 |
| JP | 2004-260068 A | 9/2004 |
| JP | 2006-210689 A | 8/2006 |
| JP | 2007-332418 A | 12/2007 |
| KR | 20040074940 A | 8/2004 |
| KR | 20090084517 A | 8/2009 |
| WO | 03/102277 A1 | 12/2003 |
| WO | 2010122918 A | 10/2010 |
| WO | WO 2011/138876 A1 | 11/2011 |

OTHER PUBLICATIONS

Office Action from U.S. Appl. No. 13/635,147 dated Mar. 14, 2014.
Office Action from U.S. Appl. No. 13/635,147 dated Sep. 5, 2013.

* cited by examiner

LIQUID CRYSTAL POLYMER COPPER-CLAD LAMINATE AND COPPER FOIL USED FOR SAID LAMINATE

TECHNICAL FIELD

The present invention relates to a liquid crystal polymer copper-clad laminate and, particularly, to a liquid crystal polymer copper-clad laminate used for a high frequency printed circuit board. Also, the invention relates to a copper foil used for the liquid crystal polymer copper-clad laminate.

Copper and copper alloy foils (hereinafter collectively referred to as copper foil) greatly contributes to the development of electric and electronic-related industries and, particularly, serve as an indispensable material as a printed circuit material. In general, a copper foil for printed circuit board is laminate-bonded to a substrate such as a synthetic resin board and a film under high temperature and pressure with or without an adhesive agent to produce a copper-clad laminate. After that, in order to form a desired circuit, a resist coating step and an exposure step are performed to print a necessary circuit, and then etching for eliminating unnecessary portions is performed.

A variety of printed circuit boards for electronic devices are obtained by finally soldering desired elements. The copper foil for printed circuit board should meet various demands, which are different between a surface to be bonded to a resin substrate (a roughened surface) and a surface not to be bonded to the resin substrate (a shiny surface).

For example, among the demands for the roughened surface formed on the copper foil, predominant demands are 1) resistance to oxidative discoloration during storage, 2) satisfactory peel strength with the substrate after high temperature heating, wet treatment, soldering, a chemical treatment, and the like, 3) free from a so-called etching residue which is generated after lamination with the substrate and etching, and the like.

Since there is an increasing tendency that the circuit is easily peeled off due to a hydrochloride etching liquid along with the development of fine pattern in a printed circuit of a printed circuit board. i.e., along with thinning of the circuit, prevention of the peeling is required. Also, when the circuit is thinned, since the circuit is easily peeled off due to a high temperature during treatment such as the soldering. Thus, prevention of the peeling is also required. As the fine pattern is being further developed nowadays, capability of etching of a printed circuit having a circuit width of 150 μm pitch or less with a $CuCl_2$ etching liquid, for example, is now an essential requirement, and alkali etching is becoming one of the requirements in association with the diversification of the resist and the like.

In order to meet the demands, the applicant succeeded in developing a method for treating a copper foil including the steps of performing roughening process on a surface of the copper foil by copper-cobalt-nickel alloy plating, and then forming a cobalt plated layer or a cobalt-nickel alloy plated layer. The method enables not only to fulfill the above-described many general properties as the copper foil for printed circuit, but also to provide inhibition for decreasing in heat-resistant peel strength when an acrylic adhesive agent is used and excellent oxidation resistance (see Patent Literature 1).

Preferably, after forming the cobalt plated layer or the cobalt-nickel alloy plated layer, anti-corrosive treatment of is performed. The typical examples of the anti-corrosive treatment include single coating treatment using chrome oxide and mixed coating treatment using chrome oxide, zinc, and/or zinc oxide.

Further, with the development of electronic appliances, the demand for improvement in heat-peeling resistance of the copper foil circuit board has been increasingly severe. The applicant succeeded in developing a method for treating a copper foil for printing excellent in heat resistance, which includes performing a roughening treatment on a surface of the copper foil by copper-cobalt-nickel alloy plating, forming a cobalt-nickel alloy plated layer, and then forming a zinc-nickel alloy plated layer (Patent Literature 2). This was a very effective invention and is one of the predominant products of the current copper foil circuit materials.

Later on, along with downsizing and high integrity of semiconductor devices, a frequency of an electric signal of electronic appliances has progressively shifted to a higher level. Accordingly, a liquid crystal polymer which is excellent in dielectric property is used as a high frequency substrate in place of a polyimide film which has heretofore been used as an insulating resin substrate. For example, Patent Literature 3 describes a copper foil for high frequency printed circuit board in which it is possible to produce a copper-clad laminate by laminating a liquid crystal polymer film and a copper foil and to form a fine pattern on the copper-clad laminate.

PRIOR ART LITERATURE

Patent Literature

Patent Literature 1: Japanese Patent Application Publication No. 6-54831
Patent Literature 2: Japanese Patent No. 2849059
Patent Literature 3: Japanese Patent Application Laid-Open No. 2006-210689

SUMMARY OF INVENTION

Problem to be Solved

However, in the printed circuit board using the liquid crystal polymer, in the case of using the copper foil for printed circuit referred to in Patent Literature 2, which is obtained by performing roughening treatment with copper-cobalt-nickel alloy plating on a surface of the copper foil, forming a cobalt-nickel alloy-plated layer, and then forming the zinc-nickel alloy-plated layer, there arises a problem of roughening particle residue which is generated on the liquid crystal polymer resin surface after the circuit etching in the fine pattern circuit of the copper-clad laminate is detected. Therefore, it is desired to solve the problem.

Accordingly, an object of the present invention is to provide a copper-clad laminate including a copper foil bonded to a liquid crystal polymer wherein a roughening treatment with copper-cobalt-nickel alloy plating is performed on the copper foil, which shows excellent peel strength and is free from roughening particle residue on a surface of the liquid crystal polymer resin after copper foil circuit etching. Another object of the present invention is to provide a copper foil which is suitable for production of such copper-clad laminate.

Solution to Problem

The present invention provides the following inventions:
(1) A copper-clad laminate comprising a copper foil bonded to a liquid crystal polymer, wherein the copper foil has a primary particle layer of copper on a bonding surface to the liquid crystal polymer and a secondary particle layer of a ternary alloy comprising copper, cobalt and nickel formed on the primary particle layer, the primary particle layer having an average particle size of 0.25 to 0.45 µm and the secondary particle layer having an average particle size of 0.05 to 0.25 µm.

(2) The copper-clad laminate according to (1), wherein each of the primary particle layer and the secondary particle layer is an electroplated layer.

(3) The copper-clad laminate according to (1) or (2), wherein the secondary particle is a dendritic particle or a plurality of dendritic particles which grows or grow on the primary particle.

(4) The copper-clad laminate according to any one of (1) to (3), wherein bonding strength to the liquid crystal polymer is 0.60 kg/cm or more.

(5) The copper-clad laminate according to any one of (1) to (4), wherein roughness Rz of the bonding surface of the copper foil to the liquid crystal polymer is 1.5 µm or less.

(6) The copper-clad laminate according to any one of (1) to (5), wherein roughness Rz of the bonding surface of the copper foil to the liquid crystal polymer is 1.0 µm or less.

(7) The copper-clad laminate according to any one of (1) to (6), wherein the copper-clad laminate is used for a high frequency printed circuit board.

(8) A copper foil to be bonded to the liquid crystal polymer, wherein the copper foil has a primary particle layer of copper on a bonding surface to the liquid crystal polymer and a secondary particle layer of a ternary alloy comprising copper, cobalt and nickel formed on the primary particle layer, the primary particle layer having an average particle size of 0.25 to 0.45 µm and the secondary particle layer having an average particle size of 0.05 to 0.25 µm.

(9) The copper foil according to (8), wherein each of the primary particle layer and the secondary particle layer is an electroplated layer.

(10) The copper foil according to (8) or (9), wherein bonding strength to the liquid crystal polymer is 0.60 kg/cm or more.

(11) The copper foil according to any one of (8) to (10), wherein roughness Rz of the bonding surface of the copper foil to the liquid crystal polymer is 1.5 µm or less.

(12) The copper foil according to any one of (8) to (10), wherein roughness Rz of the bonding surface of the copper foil to the liquid crystal polymer is 1.0 µm or less.

Also, it is possible to provide a copper foil for printed circuit, wherein a cobalt-nickel alloy plated layer is formed on the secondary particle layer obtained by the copper-cobalt-nickel alloy plating. A zinc-nickel alloy plated layer may be formed on the cobalt-nickel alloy plated layer.

In the cobalt-nickel alloy plated layer, a cobalt deposition amount may be 200 to 3000 µg/dm$^2$, and a proportion of the cobalt may be 60 to 66 mass %. There may be formed a zinc-nickel alloy plated layer with a total amount thereof within the range of 150 to 500 µg/dm$^2$, a nickel amount 50 µg/dm$^2$ or more, and a nickel ratio 0.16 to 0.40.

An anti-corrosive treatment layer may be formed on the zinc-nickel alloy plated layer. In the anti-corrosive treatment, a single coating treatment layer of chrome oxide or a mixed coating treatment layer of chrome oxide and zinc and/or zinc oxide may be formed. Further, a silane coupling layer may be formed on the mixed coating treatment layer.

Advantageous Effects of Invention

A copper-clad laminate according to the present invention has excellent peel strength with a liquid crystal polymer (LCP) and has a property of not generating a roughening particle residue on a surface of the liquid crystal polymer after circuit etching.

Also, since abnormally grown particles are reduced, particle size becomes uniform, and it is possible to cover an entire surface, etching property is improved, making it possible to form a circuit with high accuracy.

Along with the development of electronic appliances, downsizing and high integration of semiconductor devices have further progressed. There is a severer demand for the treatments performed in production processes of printed circuits for the semiconductor devices. The present invention has the technological effects which meet the demand.

DESCRIPTION OF EMBODIMENTS

A liquid crystal polymer to be used as an insulating substrate forming a copper-clad laminate is not particularly limited, and examples thereof include wholly aromatic polyester obtainable by homopolymerization or copolymerization of aromatic hydroxylcarboxylic acid, aromatic dicarboxylic acid, aromatic diol, aromatic hydroxylamine, aromatic diamine, aromatic aminocarboxylic acid, and the like. The liquid crystal polymer is ordinarily provided in the form of a film. Bonding between the liquid crystal polymer and a copper foil may generally be performed by thermocompression bonding.

The copper foil to be used in the present invention may be an electrolytic copper foil or a rolled copper foil. Roughening treatment is ordinarily performed on a surface of the copper foil to be bonded to a resin substrate, i.e. on a roughened surface, by electrodeposition in a "knob" shape on a surface of the copper foil after degreasing in order to improve peel strength of the copper foil after lamination. The electrolytic copper foil has the bumps when produced, and the bumps are further enlarged by reinforcing the convex portion of the electrolytic copper foil by the roughening treatment.

The conditions of the treatment may be a little varied between the rolled copper foil and the electrolytic copper foil. In the present invention, "roughening treatment" includes these pre-treatment and finish treatment, and also known treatment relating to copper foil roughening treatment performed as appropriate.

The roughening treatment is performed by copper-cobalt-nickel alloy plating (in the following description, the roughening treatment of the copper-cobalt-nickel alloy plating is referred to as "secondary particle layer" in order to clarify the difference from the preceding treatment). However, as described above, the problem of etching residue and the like can occur on the liquid crystal polymer surface when the copper-cobalt-nickel alloy plated layer is simply formed on the copper foil.

Figure 3:
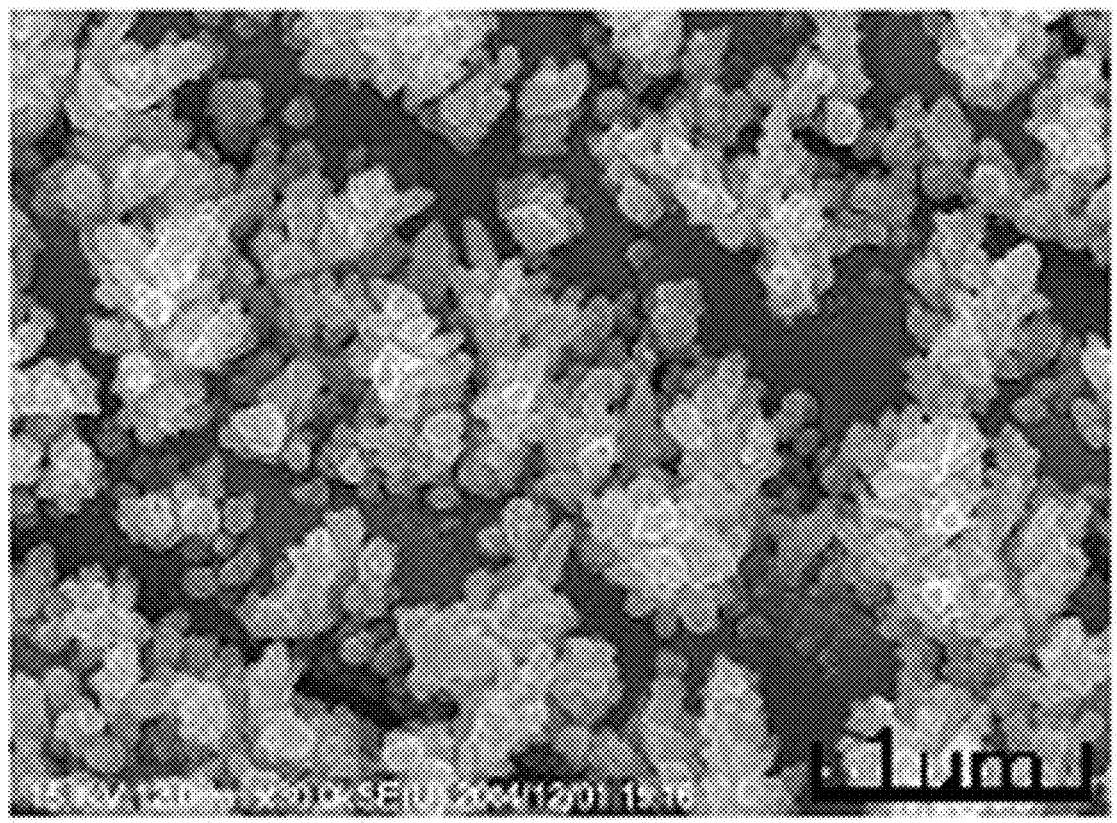
FIG. 3 is a microscope photograph of a surface in case where the roughening treatment with copper-cobalt-nickel alloy plating is performed on a conventional copper foil.

Shown in FIG. 3 is a microscope photograph of a surface of the copper foil on which the copper-cobalt-nickel alloy plated layer is formed. As shown in FIG. 3, fine particles dendritically grown may be observed. In general, the dendritic fine particles shown in FIG. 3 are formed by a high current density.

In the case of the high current density processing, nucleation of the particles in the initial electrodeposition is suppressed, and a new particle nucleus is formed at the particle tip. Therefore, the particle dendritically grown has the thin and long shape. In case where the dendritic roughening particles shown in FIG. 3 are formed, since the particle has the sharp wedge shape, the roughening particles are driven into the inside of the liquid crystal polymer substrate, and the excellent adhesion with the substrate is exhibited. However, on the other hand, a problem that the fine roughening particle penetrated into the substrate remains as a residue on the resin surface after the circuit etching occurs.

Figure 4:
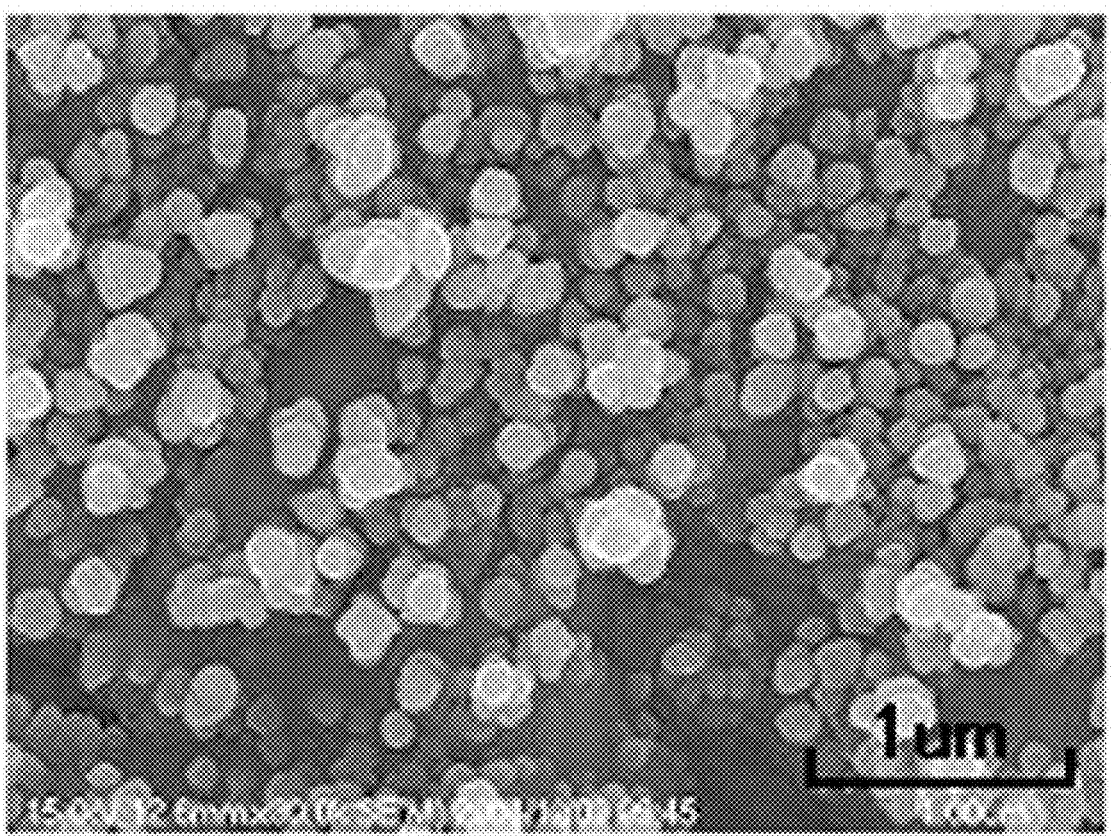
FIG. 4 is a microscope photograph of a surface in case where a current density and a processing speed were reduced when performing the roughening treatment with copper-cobalt-nickel alloy plating on a copper foil.

Accordingly, when the electroplating is performed at a reduced current density in order to prevent the residue, the sharp rising edge disappears as shown in FIG. 4, the number of particles is increased, and the round shaped particles are grown. However, though the powder falling is suppressed under the circumstances shown in FIG. 4, the peel strength with the liquid crystal polymer is unsatisfactory.

Figure 1:
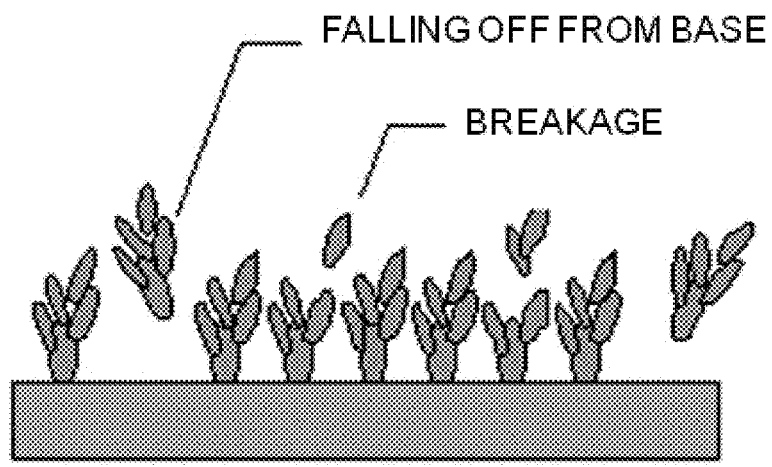
FIG. 1 is a conceptual diagram illustrating a cause for an etching residue in case where roughening treatment with copper-cobalt-nickel alloy plating is performed on a conventional copper foil.

The cause for the generation of the etching residue in case where the copper-cobalt-nickel plated layer shown in FIG. 3 is formed is shown in the conceptual diagram of FIG. 1. The dendritic fine particles are formed on the copper foil as described above, and, since a part of the branch of each of the dendritic particles is easily broken or the dendritic particles fall off from the base by an external force, the dendritic particles tend to remain after the etching. Also, the fine dendritic particles can be the cause of dirt on a roll due to stripping and a stripped powder generated by "rubbing" during the treatment.

Figure 2:
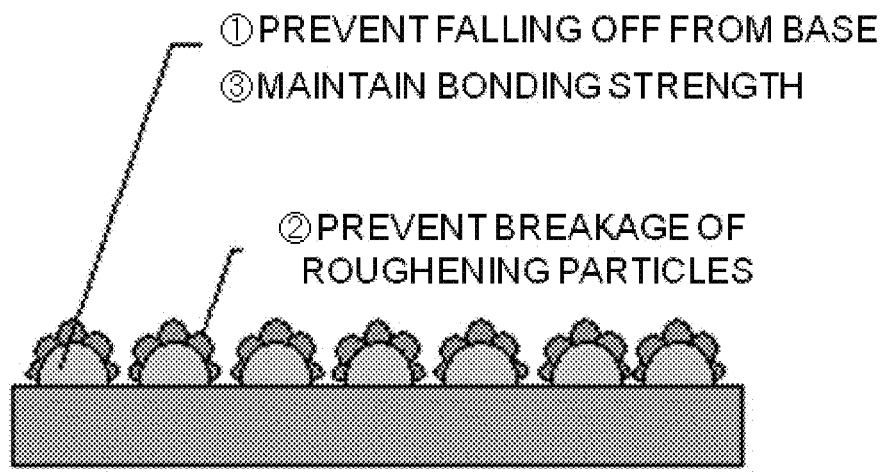
FIG. 2 is a conceptual diagram illustrating a copper foil treated layer of the present invention, in which the copper foil treated layer is obtained by forming a primary particle layer on a copper foil and forming a secondary particle layer including a copper-cobalt-nickel alloy plating on the primary particle layer, whereby an etching residue is suppressed.
Figure 5:
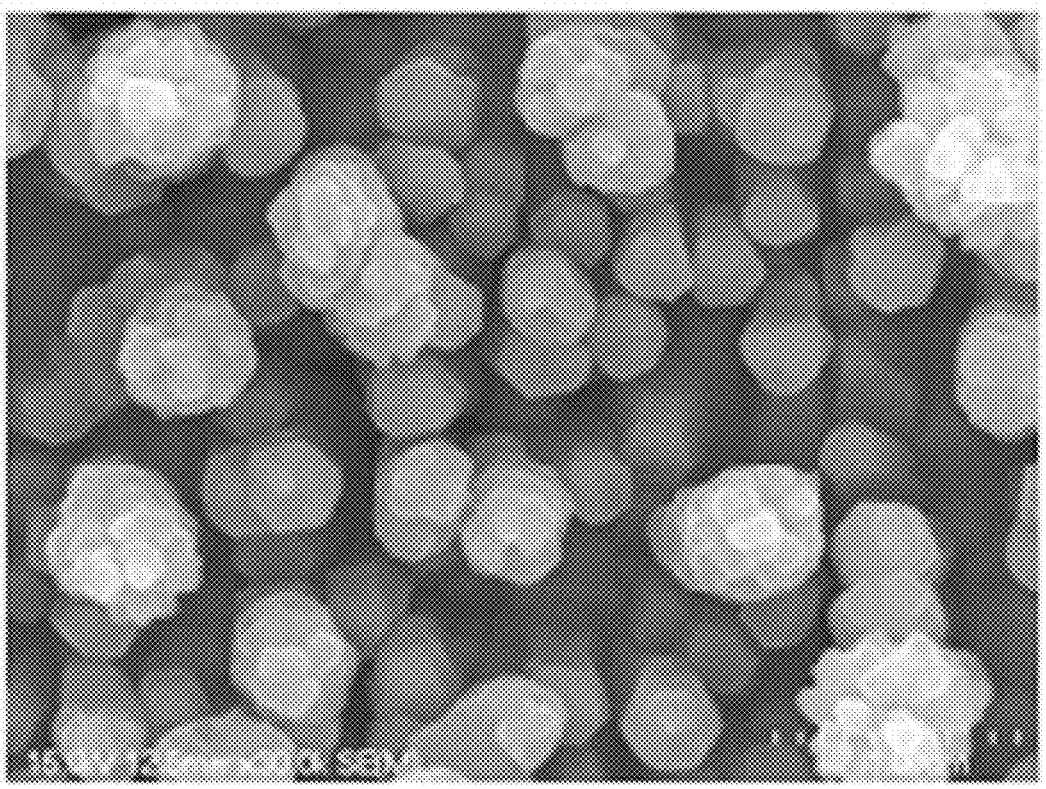
FIG. 5 is a microscope photograph of a copper foil treated layer of the present invention, in which the copper foil treated layer is obtained by forming a primary particle layer on a copper foil in advance and forming a secondary particle layer of a copper-cobalt-nickel alloy plating on the primary particle layer, whereby the etching residue is suppressed.
Figure 6:
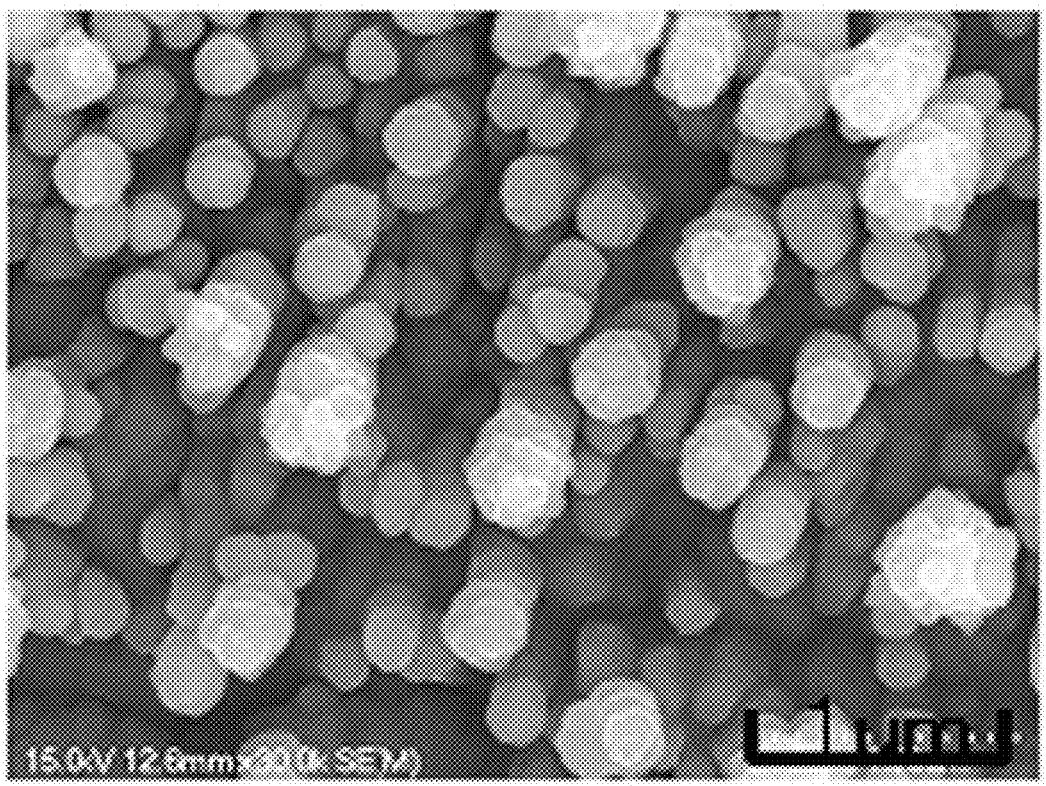
FIG. 6 is a microscope photograph of a surface of which roughness is further improved in the layer of the copper foil treated surface of the present invention, in which the copper foil treated layer is obtained by forming a primary particle layer on a copper foil in advance and forming a secondary particle layer of a copper-cobalt-nickel alloy plating on the primary particle layer, whereby the etching residue is suppressed.

In the present invention, after forming the copper primary particle layer on the surface of copper foil in advance, the secondary particle layer made from a ternary alloy formed of copper, cobalt and nickel is formed on the primary particle layer. Shown in FIG. 2 is the conceptual diagram of the present invention. Shown in FIGS. 5 and 6 are microscope photographs of a surface in which the primary particles and the secondary particles are formed on the copper foil (details are described later).

According to the present invention described above, the dirt on the roll and the etching residue due to the stripping and the stripped powder caused by the "rubbing" during the treatment are eliminated. Further, a copper foil for high frequency printed circuit board which has the properties of the excellent peel strength with the liquid crystal polymer and not generating the roughening particle residue on the liquid crystal polymer surface after the circuit etching is obtained. As used herein, "high frequency" generally means 1 GHz or more and typically 5 to 30 GHz.

As is apparent from the working examples described later in this specification, the optimum conditions for preventing the etching residue includes an average particle size of the primary particle layer of 0.25 to 0.45 μm and an average particle size of the secondary particle layer made from the ternary alloy formed of copper, cobalt and nickel of 0.05 to 0.25 μm.

Each of the primary particle layer and the secondary particle layer may be formed of an electroplated layer. The secondary particle has the characteristics that it is a dendritic particle or a plurality of dendritic particles which is/are grown on the primary particle(s).

As described above, the average particle size of the secondary particle layer is 0.05 to 0.25 μm, which is relatively small, and the particle diameter is in other words a height of the particle. In short, one of the characteristics of the present invention is to suppress the height of the secondary particle for suppressing the stripping of particles (powder falling) which becomes the cause of the etching residue generation. Also, due to the double structure of the primary particle layer and the secondary particle layer of the present invention, the excellent peel strength can be ensured.

The copper foil having the primary particle layer and the secondary particle layer formed as described above attains bonding strength with liquid crystal polymer of 0.60 kg/cm or more.

Also, as for roughness Rz of the surface on which the primary particle layer and the secondary particle layer are formed, it can be 1.5 μm or less, or furthermore it can be 1.0 μm or less. The reduction of surface roughness is more effective for suppressing the etching residue. With the use of the copper foil according to the present invention, it is possible to provide a copper-clad laminate for high frequency printed circuit board having the above-described quality and properties.

Copper Primary Particle Plating Conditions

One example of the copper primary particle plating conditions is as follows. The plating conditions are not more than the preferred example, and the average particle size of the copper primary particles formed on the copper foil has the role of preventing the powder falling which is the predominant cause of the etching residue. Therefore, plating conditions other than those described below are not inhibited at all insofar as the average particle size is within the scope of the present invention. The present invention encompasses such plating conditions.

Liquid composition: 10 to 20 g/L of copper, 50 to 100 μg/L of sulfuric acid

Liquid temperature: 25° C. to 50° C.

Current density: 1 to 58 A/dm$^2$

Coulomb amount: 4 to 81 As/dm$^2$

Secondary Particle Plating Conditions

As is the case described above, the plating conditions are not more than the preferred example, and the average particle size has the role of preventing the powder falling. Therefore, plating conditions other than those described below are not inhibited at all insofar as the average particle size is within the scope of the present invention. The present invention encompasses such plating conditions, Liquid composition: 10 to 20 μg/L, of copper, 5 to 15 μg/L of nickel, 5 to 15 g/L of cobalt pH: 2 to 3

Liquid temperature: 30° C. to 50° C.

Current density: 24 to 50 A/dm$^2$

Coulomb amount: 34 to 48 As/dm$^2$

Plating Conditions for Forming Heat Resistant Layer 1

In the present invention, a heat resistant layer may be formed on the secondary particle layer. The plating conditions are as follows.

Liquid composition: 5 to 20 g/L of nickel, 1 to 8 g/L of cobalt pH: 2 to 3

Liquid temperature: 40° C. to 60° C.

Current density: 5 to 20 A/dm$^2$

Coulomb amount: 10 to 20 As/dm$^2$

Plating Conditions for Forming Heat Resistant Layer 2

In the present invention, the following heat resistant layer may be further formed on the secondary particle layer. The plating conditions are as follows.

Liquid composition: 2 to 30 g/L of nickel, 2 to 30 g/L of zinc pH: 3 to 4

Liquid temperature: 30° C. to 50° C.

Current density: 1 to 2 A/dm$^2$

Coulomb amount: 1 to 2 As/dm$^2$

Plating Conditions for Forming Anti-Corrosion Layer

In the present invention, an anti-corrosion layer may be formed. The plating conditions are as follows. The conditions in the case of a dipping chromate treatment are described below, but an electrolysis chromate treatment may be employed.

Liquid composition: 1 to 10 g/L of potassium bichromate, 0 to 5 g/L of zinc pH: 3 to 4

Liquid temperature: 50° C. to 60° C.

Current density: 0 to 2 A/dm$^2$ (for dipping chromate treatment)

Coulomb amount: 0 to 2 As/dm$^2$ (for dipping chromate treatment)

Types of Weather Resistant layer

A silane coupling treatment of coating a silane coupling agent on at least a roughened surface of an anti-corrosion layer may be performed.

The silane coupling agent is appropriately selected from examples thereof including olefin-based silane, epoxy-based silane, acryl-based silane, amino-based silane, and mercapto-based silane.

As a coating method, the silane coupling solution may be coated by spray coating, a coater, dipping, casting, or the like. Since these methods are well-known technologies (see, for example, Japanese Examined Patent Publication No. 60-15654), details thereof are not described herein.

As the copper-cobalt-nickel alloy plating used as the secondary particles, a ternary alloy layer containing copper in a deposition amount of 10 to 30 mg/dm$^2$, cobalt in a deposition amount of 100 to 3000 μg/dm$^2$, and nickel in a deposition amount of 50 to 500 μg/dm$^2$ is formed by electrolytic plating.

When the Cu deposition amount is less than 10 mg/dm$^2$, it is difficult to form roughening particles having a satisfactory size, and, therefore, a substrate adhesion tends to be deteriorated. When the Cu deposition amount exceeds 30 mg/dm$^2$, heat resistance and chemical resistance among substrate properties tend to be deteriorated.

When the Co deposition amount is less than 100 μg/dm$^2$ an etching property tends to be deteriorated. The Co deposition amount exceeding 3000 μg/dm$^2$ is not preferred in case where it is necessary to consider the influence of magnetism, and deterioration of acid resistance and chemical resistance could be considered.

When the Ni deposition amount is less than 50 μg/dm$^2$, heat resistance is deteriorated. On the other hand, when the Ni deposition amount exceeds 500 μg/dm$^2$, the etching property is deteriorated. That is, the etching residue is generated, and formation of a fine pattern becomes difficult though it is not too difficult to make it impossible to perform the etching. A preferred Co deposition amount may be 500 to 2000 μg/dm$^2$, and a preferred nickel deposition amount may be 50 to 300 μg/dm$^2$.

In view of the above, it may be said that the desirable deposition amounts in the copper-cobalt-nickel alloy plating are 10 to 30 mg/dm$^2$ of copper, 100 to 3000 μg/dm$^2$ of cobalt, and 50 to 500 μg/dm$^2$ of nickel. Deposition amounts of the ternary alloy layer are not more than desirable conditions and do not deny ranges which exceed the desirable conditions.

In general, in the case of forming a circuit, an alkaline etching liquid and a copper chloride-based etching liquid described in the following examples are used. The etching liquids and the etching conditions have versatility, and it should be understood that the conditions are not limitative and can be arbitrarily selected.

In the present invention, after forming the secondary particles (after roughening treatment) as described above, a cobalt-nickel alloy plated layer may be formed on the roughened surface.

The cobalt-nickel alloy plated layer contains cobalt in a deposition amount of 200 to 3000 μg/dm$^2$, and a cobalt ratio may preferably be 60 to 66 mass %. The treatment is considered to be a type of anti-corrosive treatment in a broad sense.

The cobalt-nickel alloy plated layer should be formed to the extent which does not substantially deteriorate the bonding strength between the copper foil and the substrate. The cobalt deposition amount of less than 200 μg/dm$^2$ is not preferable as the heat-resistant peel strength is decreased, acid resistance and chemical resistance are deteriorated, and reddening of the processed surface occurs.

A cobalt deposition amount exceeding 3000 μg/dm$^2$ is not preferred in case where it is necessary to consider the influence of magnetism and deterioration of the acid resistance and chemical resistance is considered. A preferred cobalt deposition amount is 400 to 2500 μg/dm$^2$.

On the other hand, when a nickel deposition amount is small, the heat-resistant peel strength is deteriorated, and the anti-oxidation resistance and chemical resistance are deteriorated. In case where the nickel deposition amount is too large, alkali etching property is deteriorated.

In the present invention, a zinc-nickel alloy plated layer may be formed on the cobalt-nickel alloy plating. A total amount of the zinc-nickel alloy plated layer is maintained to be 150 to 500 μg/dm$^2$ and a nickel ratio is maintained to be 16 to 40 mass %. The zinc-nickel alloy plated layer has a role as a heat resistant anti-corrosion layer. The conditions are not more than preferred conditions, too, and other well-known zinc-nickel alloy plating may be used. It should be understood that the zinc-nickel alloy plating is a preferred additional condition in the present invention.

A temperature in the treatments performed in the printed circuit production process is becoming increasingly high, and heat generation during the use of an appliance after the production should be considered. For example, a so-called two-layer material, which is obtained by bonding a copper foil to a resin by thermocompression bonding, is subjected to heat of 300° C. or more in bonding. It is necessary to prevent deterioration of a bonding force between the copper foil and the resin substrate, and the zinc-nickel alloy plating is effective for the prevention.

In case where the total amount of the zinc-nickel alloy plated layer is less than 150 µg/dm², a heat-resistant anti-corrosion property is deteriorated to make it difficult to attain the role as the heat resistance anti-corrosion layer. When the total amount exceeds 500 µg/dm², the hydrochloric acid resistance tends to be deteriorated.

As described above, in the present invention, the cobalt-nickel alloy plated layer and, further, the zinc-nickel alloy plated layer may be formed in this order as appropriate on the copper-cobalt-nickel alloy plated layer functioning as the secondary particle layer. It is possible to adjust a total cobalt deposition amount and a total nickel deposition amount in the layers. It is preferable to maintain the total cobalt deposition amount of 300 to 4000 µg/dm² and the total nickel deposition amount of 150 to 1500 µg/dm².

When the cobalt total deposition amount is less than 300 µg/dm², the heat resistance and the chemical resistance are deteriorated. When the total cobalt deposition amount exceeds 4000 µg/dm², etching stains can occur. Also, when the total nickel deposition amount is less than 150 µg/dm², the heat resistance and the chemical resistance are deteriorated. When the total nickel deposition amount exceeds 1500 µg/dm², the etching residue is generated.

Preferably, the total cobalt deposition amount is 1500 to 3500 µg/dm², and the total nickel deposition amount is 500 to 1000 µg/dm². Insofar as the foregoing conditions are satisfied, the conditions of the present paragraph are not limitative.

Subsequently, anti-corrosive treatment is performed as required. Preferred anti-corrosive treatment in the present invention is coating treatment using chrome oxide alone or a mixed coating treatment using chrome oxide and zinc/zinc oxide. The mixed coating treatment using chrome oxide and zinc/zinc oxide means treatment of coating an anti-corrosion layer of a zinc-chrome mixture formed of zinc or zinc oxide and chrome oxide by employing electroplating using a plating bath containing a zinc salt or zinc oxide and a chromate.

As the plating bath, a mixture solution of at least one of dichromates such as $K_2Cr_2O_7$ and $Na_2Cr_2O$; and $CrO3$, at least one of water-soluble zinc salts such as ZnO and $ZnSO_4 \cdot 7H_2O$, and an alkali hydroxide is typically used. Typical plating bath composition and electrolysis conditions are described later in this specification.

A copper foil obtained as described above has excellent peel strength with liquid crystal polymer and has anti-oxidation resistance and hydrochloric acid resistance on the liquid crystal polymer surface after the circuit etching. Also, the copper foil enables etching of a printed circuit having a circuit width of 150 µm pitch or less when a $CuCl_2$ etching liquid is used and also enables the alkali etching.

As the alkali etching liquid, liquids such as $NH_4OH$: 6 mol/L, $NH_4Cl$: 5 mol/L, and $CuCl_2$: 2 mol/L (temperature: 50° C.) are known, for example.

Finally, mainly for the purpose of improvement in bonding force between the copper foil and the liquid crystal polymer, silane treatment of coating a silane coupling agent is performed at least on the roughened surface on the anti-corrosion layer.

The examples of silane coupling agent include olefin-based silane, epoxy-based silane, acryl-based silane, amino-based silane, and mercapto-based silane. They can be appropriately chosen and used.

As a coating method, the silane coupling agent solution may be coated by spray coating, a coater, dipping, casting, or the like. For example, Japanese Examined Patent Publication No. 60-15654 describes improvement in bonding force between a copper foil and a resin substrate, which is enabled by performing a chromate treatment on a roughened surface of the copper foil, followed by the silane coupling agent treatment. For the details thereof, reference to the publication is recommended. After the treatment, annealing is performed in some cases in order to improve ductility of the copper foil.

EXAMPLES

Hereinafter, the present invention will be described based on examples and comparative examples. The examples are not more than exemplification and are not limitative. That is, the present invention encompasses other aspects and variations.

Example 1 to Example 9

A primary particle layer (Cu) and a secondary particle layer (copper-cobalt-nickel alloy plating) were formed on a rolled copper foil having a thickness of 12 µm under the below-described conditions.

Bath compositions and plating conditions are as follows.
Bath Composition and Plating Conditions
 (A) Formation of Primary Particle Layer (Cu Plating)
  Liquid composition: 15 µg/L of copper, 75 µg/L of sulfuric acid
  Liquid temperature: 35° C.
  Current density: 48 to 60 A/dm² and 1 to 10 A/dm²
  Coulomb amount: 70 to 90 As/dm² and 5 to 20 As/dm²
 (B) Formation of Secondary Particle Layer (Cu—Co—Ni Alloy Plating)
  Liquid composition: 15 g/L of copper, 8 g/L of nickel, 8 g/L of cobalt
  pH: 2
  Liquid temperature: 40° C.
  Current density: 10 to 33 A/dm²
  Coulomb amount: 30 to 45 As/dm²

Comparative Example 1 to Comparative Example 9

Bath compositions used in the comparative examples are the same as those of the examples. Plating conditions are as follows.
Plating Conditions in Comparative Example 1 to Comparative Example 4
 (A) Formation of Primary Particle Layer (Cu Plating)
  Current density: 30 to 47 A/dm² and 1 to 5 A/dm²
  Coulomb amount: 40 to 69 As/dm² and 1 to 5 As/dm²
 (B) Formation of Secondary Particle Layer (Cu—Co—Ni Alloy Plating Condition)
  Current density: 10 to 34 A/dm²
  Coulomb amount: 30 to 48 As/dm²
Plating Conditions in Comparative Example 5 to Comparative Example 7
 (A) Formation of Primary Particle Layer (Cu Plating)
  Current density: 48 to 60 A/dm² and 1 to 10 A/dm²
  Coulomb amount: 70 to 90 As/dm² and 5 to 20 As/dm²
 (B) Formation of Secondary Particle Layer (Cu—Co—Ni Alloy Plating Condition)
  Current density: 34 to 50 A/dm²
  Coulomb amount: 46 to 55 As/dm²

As to Examples 8 and 9, a heat resistant layer 1, a heat resistant layer 2, an anti-corrosion layer, and a weather resistant layer were formed by the following procedure on the roughened surface of the copper fail on which the roughening treatment was performed.

(1) Heat Resistant Layer 1

The heat resistant layer 1 was formed on the roughened surface of the copper foil on which the roughening treatment was performed. Formation conditions of the heat resistant layer 1 are described below.

Liquid composition: 5 to 20 g/L of nickel, to 8 g/L of cobalt
pH: 2 to 3
Liquid temperature: 40° C. to 60° C.
Current density: 5 to 20 A/dm$^2$
Coulomb amount: 10 to 20 As/dm$^2$ (2) Heat Resistant Layer 2

The heat resistant layer 2 was formed on the copper foil on which the heat resistant layer 1 was formed. Formation conditions of the heat resistant layer 2 are described below.

Liquid composition: 2 to 30 g/L of nickel, 2 to 30 g/L of zinc
pH: 3 to 4
Liquid temperature: 30° C. to 50° C.
Current density: 1 to 2 A/dm$^2$
Coulomb amount: 1 to 2 As/dm$^2$ (3) Anti-Corrosion Layer The anti-corrosion layer was formed on the copper foil on which the heat resistant layers 1 and 2 were formed. Formation conditions of the anti-corrosion layer are described below.

Liquid composition: 1 to 10 g/L of potassium dichromate, 0 to 5 g/L of zinc
pH: 3 to 4
Liquid temperature: 50-C to 60° C.
Current density: 0 to 2 A/dm$^2$ (for dipping chromate treatment)
Coulomb amount: 0 to 2 As/dm$^2$ (for dipping chromate treatment)

(4) Weather Resistant Layer

The weather resistant layer was formed on the copper foil on which the heat resistant layers 1 and 2 and the anti-corrosion layer were formed. Formation conditions are described below.

Examples of a silane coupling agent having an amino group include

N-2-(aminoethyl)-3-aminopropyltrimethoxysilane,
N-2-(aminoethyl)-3-aminopropyltriethoxysilane,
N-2-(aminoethyl)-3-aminopropylmethyldimethoxysilane,
3-aminopropyltrimethoxysilane, 3-aminopropyltriethoxy silane,
3-triethoxysilyl-N-(1,3-dimethyl-butylidene)propylamine,
N-phenyl-3-aminopropyltrimethoxysilane, and the like, and the weather resistant layer was formed by using one or a combination of two or more kinds of the silane coupling agents for coating, followed by drying.

Results of an average particle size of the primary particles, an average particle size of the secondary particles, peel strength, roughness (Rz), and presence/absence of a residue of roughening particles in the case of forming the primary particle layer (Cu plating) and the secondary particle layer (Cu—Co—Ni alloy plating) on the copper foil in each of the examples are shown in Table 1. Peel evaluation was conducted by preparing a peel strength evaluation sample by laminating the copper foil having 12 μm of each of the examples and the comparative examples and a liquid crystal polymer film (VECSTAR CT-25N) manufactured by Kuraray Co., Ltd. and performing circuit etching. The peel strength evaluation was conducted by a method in which a linear circuit having a width of 3 mm was formed by the above circuit etching, and by means of peeling off in a direction of 90° respective to a liquid polymer film. As to the average diameter of the primary particles, the average particle size was measured by employing a lineal intercept method in which a surface of the roughened surface of each of the samples obtained by performing the roughening treatment on the copper foil was observed with an electronic microscope (S4700 manufactured by Hitachi High-Technologies Corporation) at magnification of ×30000. More specifically, 4 vertical measurement lines and 4 horizontal measurement lines were drawn at positions where a grain boundary was clear and easy to measure, and the average particle size was measured from the numbers of particles intersecting with the measurement lines. As to the average diameter of the secondary particles, the average particle size was measured by employing a lineal intercept method in which a surface of the roughened surface of each of the samples obtained by performing the roughening treatment on the copper foil was observed with an electronic microscope (S4700 manufactured by Hitachi High-Technologies Corporation) at magnification of ×30000. More specifically, 4 vertical measurement lines and 4 horizontal measurement lines were drawn at positions where a grain boundary was clear and easy to measure, and the average particle size was measured from the numbers of particles intersecting with the measurement lines. As the roughness (Rz), contact roughness of the copper foil surface on which the roughening treatment was performed was measured by using a roughness tester manufactured by Kosaka Laboratories, Ltd.

The copper foil of the above copper-clad laminate was subjected to etching removal using a typical copper chloride solution for circuit etching, and then a liquid crystal polymer film surface was observed with an optical microscope to observe discoloration due to presence/absence of the residue of roughening particles. Results of the comparative examples are also shown in Table 1.

TABLE 1

|  | Primary particle average diameter (μm) | Secondary particle average diameter (μm) | Peel strength (kg/cm) | Roughness Rz (μm) | Discoloration of liquid crystal polymer substrate resin due to residue of roughening particles |
|---|---|---|---|---|---|
| Example 1 | 0.25 | 0.05 | 0.62 | 0.98 | Not observed |
| Example 2 | 0.25 | 0.15 | 0.63 | 0.98 | Not observed |
| Example 3 | 0.25 | 0.25 | 0.64 | 1.20 | Not observed |
| Example 4 | 0.35 | 0.05 | 0.65 | 1.20 | Not observed |
| Example 5 | 0.35 | 0.15 | 0.66 | 1.20 | Not observed |
| Example 6 | 0.35 | 0.25 | 0.67 | 1.51 | Not observed |
| Example 7 | 0.45 | 0.05 | 0.66 | 1.21 | Not observed |

TABLE 1-continued

| | Primary particle average diameter (μm) | Secondary particle average diameter (μm) | Peel strength (kg/cm) | Roughness Rz (μm) | Discoloration of liquid crystal polymer substrate resin due to residue of roughening particles |
|---|---|---|---|---|---|
| Example 8 | 0.45 | 0.15 | 0.67 | 1.54 | Not observed |
| Example 9 | 0.45 | 0.25 | 0.67 | 1.60 | Not observed |
| Comparative Example 1 | 0.15 | 0.05 | 0.49 | 0.87 | Not observed |
| Comparative Example 2 | 0.15 | 0.15 | 0.49 | 0.88 | Not observed |
| Comparative Example 3 | 0.15 | 0.25 | 0.51 | 0.90 | Blackening was observed |
| Comparative Example 4 | 0.15 | 0.35 | 0.52 | 0.91 | Blackening was observed |
| Comparative Example 5 | 0.25 | 0.35 | 0.64 | 1.15 | Blackening was observed |
| Comparative Example 6 | 0.35 | 0.35 | 0.66 | 1.50 | Blackening was observed |
| Comparative Example 7 | 0.45 | 0.35 | 0.66 | 1.55 | Blackening was observed |
| Comparative Example 8 | 0.25 | 0 | 0.57 | 1.10 | Not observed |
| Comparative Example 9 | 0 | 0.60 | 0.65 | 0.78 | Blackening was observed |

As is apparent from Table 1, the results of the examples are as follows.

For the formation of the primary particles in Example 1, the current density was maintained to be 51 A/dm$^2$ and 2 A/dm$^2$, and the coulomb amount was maintained to be 72 As/dm$^2$ and 8 As/dm$^2$. Also, for the formation of the secondary particles, the current density was maintained to be 24 A/dm$^2$, and the coulomb amount was maintained to be 34 As/dm$^2$.

Each of the current density and the coulomb amount was changed in the two-stage manner for the formation of the primary particles, and the two-stage electroplating is ordinarily necessary for the formation of the primary particles. More specifically, the two-stage electroplating includes the plating conditions for nucleus particle formation in the first stage and the electroplating for the growth of the nucleus particles in the second stage. The first plating conditions are for the electroplating conditions for the nucleus forming particle formation at the first stage, and the subsequent plating conditions are electroplating conditions for the growth of the nucleus particle in the second stage. The same applies to the rest of the examples and the comparative examples, and the explanation will not be repeated.

As a result, Example 1 had the characteristics of the average particle size of the primary particles of 0.25 μm, the average particle size of the secondary particles of 0.05 μm, the normal peel strength of as high as 0.62 kg/cm, the surface roughness Rz of 0.98 μm, and being free from the discoloration due to the residue of the roughening particles after the circuit etching.

For the formation of the primary particles in Example 2, the current density was maintained to be 51 A/dm$^2$ and 2 A/dm$^2$, and the coulomb amount was maintained to be 72 As/dm$^2$ and 8 As/dm$^2$. Also, for the formation of the secondary particles, the current density was maintained to be 28 A/dm$^2$, and the coulomb amount was maintained to be 39 As/dm$^2$.

As a result, Example 2 had the characteristics of the average particle size of the primary particles of 0.25 μm the average particle size of the secondary particles of 0.15 μm, the normal peel strength of as high as 0.63 kg/cm, the surface roughness Rz of 0.98 μm, and being free from the discoloration due to the residue of the roughening particles after the circuit etching.

For the formation of the primary particles in Example 3, the current density was maintained to be 51 A/dm$^2$ and 2 A/dm$^2$, and the coulomb amount was maintained to be 72 As/dm$^2$ and 8 As/dm$^2$. Also, for the formation of the secondary particles, the current density was maintained to be 31 A/dm$^2$, and the coulomb amount was maintained to be 44 As/dm$^2$.

As a result, Example 3 had the characteristics of the average particle size of the primary particles of 0.25 nm, the average particle size of the secondary particles of 0.25 μm, the normal peel strength of as high as 0.64 kg/cm, the surface roughness Rz of 1.02 μm, and being free from the discoloration due to the residue of the roughening particles after the circuit etching.

For the formation of the primary particles in Example 4, the current density was maintained to be 55 A/dm$^2$ and 3 A/dm$^2$, and the coulomb amount was maintained to be 77 As/dm$^2$ and 12 As/dm$^2$. Also, for the formation of the secondary particles, the current density was maintained to be 24 A/dm$^2$, and the coulomb amount was maintained to be 34 As/dm$^2$.

As a result, Example 4 had the characteristics of the average particle size of the primary particles of 0.35 μm, the average particle size of the secondary particles of 0.05 μm, the normal peel strength of as high as 0.65 kg/cm, the surface roughness Rz of 1.20 μm, and being free from the discoloration due to the residue of the roughening particles after the circuit etching.

For the formation of the primary particles in Example 5, the current density was maintained to be 55 A/dm$^2$ and 3 A/dm$^2$, and the coulomb amount was maintained to be 77 As/dm$^2$ and 12 As/dm$^2$. Also, for the formation of the secondary particles, the current density was maintained to be 28 A/dm$^2$, and the coulomb amount was maintained to be 39 As/dm$^2$.

As a result, Example 5 had the characteristics of the average particle size of the primary particles of 0.35 μm, the average particle size of the secondary particles of 0.15 μm, the normal peel strength is 0.66 kg/cm which is high, the surface roughness Rz of 1.20 µm, and being free from the discoloration due to the residue of the roughening particles after the circuit etching.

For the formation of the primary particles in Example 6, the current density was maintained to be 55 A/dm² and 3 A/dm², and the coulomb amount was maintained to be 77 As/dm² and 12 As/dm². Also, for the formation of the secondary particles, the current density was maintained to be 31 A/dm², and the coulomb amount was maintained to be 44 As/dm².

As a result, Example 6 had the characteristics of the average particle size of the primary particles of 0.35 µm, the average particle size of the secondary particles of 0.25 µm, the normal peel strength of as high as 0.67 kg/cm, the surface roughness Rz of 1.51 µm, and being free from the discoloration due to the residue of the roughening particles after the circuit etching.

For the formation of the primary particles in Example 7, the current density was maintained to be 58 A/dm² and 4 A/dm², and the coulomb amount was maintained to be 81 As/dm² and 16 As/dm². Also, for the formation of the secondary particles, the current density was maintained to be 24 A/dm², and the coulomb amount was maintained to be 34 As/dm².

As a result, Example 7 had the characteristics of the average particle size of the primary particles of 0.45 µm, the average particle size of the secondary particles of 0.05 µm, the normal peel strength of as high as 0.66 kg/cm, the surface roughness Rz of 1.21 µm, and being free from the discoloration due to the residue of the roughening particles after the circuit etching.

For the formation of the primary particles in Example 8, the current density was maintained to be 58 A/dm² and 4 A/dm², and the coulomb amount was maintained to be 81 As/dm² and 16 As/dm². Also, for the formation of the secondary particles, the current density was maintained to be 28 A/dm², and the coulomb amount was maintained to be 39 As/dm².

As a result, Example 8 had the characteristics of the average particle size of the primary particles of 0.45 µm, the average particle size of the secondary particles of 0.15 µm, the normal peel strength of as high as 0.67 kg/cm, the surface roughness Rz of 1.54 µm, and being free from the discoloration due to the residue of the roughening particles after the circuit etching.

Further, though the heat resistant layer, the anti-corrosion layer, and the weather resistant layer were formed in Example 8, the results are approximately the same as those in Examples 1 to 7.

For the formation of the primary particles in Example 9, the current density was maintained to be 58 A/dm² and 4 A/dm², and the coulomb amount was maintained to be 81 As/dm² and 16 As/dm². Also, for the formation of the secondary particles the current density was maintained to be 31 A/dm², and the coulomb amount was maintained to be 44 As/dm².

As a result, Example 9 had the characteristics of the average particle size of the primary particles of 0.45 µm, the average particle size of the secondary particles of 0.25 µm, the normal peel strength of 0.67 kg/cm which is high, the surface roughness Rz of 1.60 µm, and being free from the discoloration due to the residue of the roughening particles after the circuit etching.

Further, though the heat resistant layer, the anti-corrosion layer, and the weather resistant layer were formed in Example 9, the results are approximately the same as those in Examples 1 to 7.

In contrast, the results of the comparative examples are as follows.

For the formation of the primary particles in Comparative Example 1, the current density was maintained to be 47 A/dm² and 1 A/dm², and the coulomb amount was maintained to be 66 As/dm² and 4 As/dm². Also, for the formation of the secondary particles, the current density was maintained to be 24 A/dm², and the coulomb amount was maintained to be 34 As/dm².

As a result, the average particle size of the primary particles was 0.15 µm, and the average particle size of the secondary particles was 0.05 µm. Though the discoloration due to the residue of the roughening particles after the circuit etching was not observed, the normal peel strength was 0.49 kg/cm which is low, and the surface roughness Rz was as low as 0.87 µm.

For the formation of the primary particles in Comparative Example 2, the current density was maintained to be 47 A/dm² and 1 A/dm², and the coulomb amount was maintained to be 66 As/dm² and 4 As/dm². Also, for the formation of the secondary particles, the current density was maintained to be 28 A/dm², and the coulomb amount was maintained to be 39 As/dm².

As a result, the average particle size of the primary particles was 0.15 µm, and the average particle size of the secondary particles was 0.5 µm. Though the discoloration due to the residue of the roughening particles after the circuit etching was not observed, the normal peel strength was as low as 0.49 kg/cm, and the surface roughness Rz was as low as 0.88 µm.

For the formation of the primary particles in Comparative Example 3, the current density was maintained to be 47 A/dm² and 1 A/dm², and the coulomb amount was maintained to be 66 As/dm² and 4 As/dm². Also, for the formation of the secondary particles, the current density was maintained to be 31 A/dm², and the coulomb amount was maintained to be 44 As/dm².

As a result, the average particle size of the primary particles was 0.15 µm, and the average particle size of the secondary particles was 0.25 µm, The normal peel strength was as low as 0.51 kg/cm, and the surface roughness Rz was 0.90 µm. The blackening due to the residue of the roughening particles was observed after the circuit etching and found to be defective.

For the formation of the primary particles in Comparative Example 4, the current density was maintained to be 47 A/dm² and 1 A/dm², and the coulomb amount was maintained to be 66 As/dm² and 4 As/dm². Also, for the formation of the secondary particles, the current density was maintained to be 34 A/dm², and the coulomb amount was maintained to be 48 As/dm².

As a result, the average particle size of the primary particles was 0.15 µm, and the average particle size of the secondary particles was as large as 0.35 µm. The normal peel strength was as low as 0.52 kg/cm, and the surface roughness Rz was 0.91 µm. The blackening due to the residue of the roughening particles was observed after the circuit etching and found to be defective.

For the formation of the primary particles in Comparative Example 5, the current density was maintained to be 51 A/dm² and 2 A/dm², and the coulomb amount was maintained to be 72 As/dm² and 8 As/dm². Also, for the formation of the secondary particles, the current density was maintained to be 34 A/dm², and the coulomb amount was maintained to be 48 As/dm².

As a result the average particle size of the primary particles was 0.25 µm, and the average particle size of the secondary particles was 0.35 µm which is large. The normal peel strength was 0.64 kg/cm, which is of the level comparative to the examples, and the surface roughness Rz was 1.15 µm. However, the blackening due to the residue of the roughening particles was observed after the circuit etching and found to be defective.

For the formation of the primary particles in Comparative Example 6, the current density was maintained to be 55 A/dm$^2$: and 3 A/dm$^2$, and the coulomb amount was maintained to be 77 As/dm$^2$ and 12 As/dm$^2$. Also, for the formation of the secondary particles, the current density was maintained to be 34 A/dm$^2$, and the coulomb amount was maintained to be 48 As/dm$^2$.

As a result, the average particle size of the primary particles was 0.35 µm, and the average particle size of the secondary particles was 0.35 µm which is large. The normal peel strength was 0.66 kg/cm which is of the level same as the examples, and the surface roughness Rz was 1.50 µm. The blackening due to the residue of the roughening particles was observed after the circuit etching and found to be defective.

For the formation of the primary particles in Comparative Example 7, the current density was maintained to be 58 A/dm$^2$ and 4 A/dm$^2$, and the coulomb amount was maintained to be 81 As/dm$^2$ and 16 As/dm$^2$. Also, for the formation of the secondary particles, the current density was maintained to be 34 A/dm$^2$, and the coulomb amount was maintained to be 48 As/dm$^2$ As a result, the average particle size of the primary particles was 0.45 µm, and the average particle size of the secondary particles was 0.35 µm which is large. The normal peel strength was 0.66 kg/cm which is of the level comparative to the examples, and the surface roughness Rz was as large as 1.55 µm. The blackening due to the residue of the roughening particles was observed after the circuit etching and found to be defective.

In Comparative Example 8, the current density was maintained to be 51 A/dm$^2$ and 2 A/dm$^2$, and the coulomb amount was maintained to be 72 As/dm$^2$ and 8 As/dm$^2$ for the formation of the primary particles on the copper foil. Only the primary particle layer was formed, and there was no secondary particle, As a result, the average particle size of the primary particles was 0.25 µm, and powder falling was not observed. The normal peel strength was as low as 0.57 kg/cm. The surface roughness Rz was 1.10 µm. Discoloration due to the residue of the roughening particles was not observed after the circuit etching.

Comparative Example 9 is a conventional example in which the primary particle is not present, and only the secondary particle layer is formed. More specifically; the current density and the coulomb amount for forming the secondary particles were maintained to be 50 A/dm$^2$ and 25 As/dm$^2$, respectively.

As a result, the average particle size of the secondary particles was as large as 0.60 µm. The normal peel strength was 0.65 kg/cm which is of the level comparative to the examples, and the surface roughness Rz was 0.78 µm. The blackening due to the residue of the roughening particles was observed after the circuit etching and found to be defective.

As is apparent from the comparison between the examples and the comparative examples, each of the copper-clad laminates of the present invention has the excellent effects of having the high peel strength with the liquid crystal polymer and being free from the residue of the roughening particles on the resin surface after the circuit etching.

The invention claimed is:

1. A copper-clad laminate comprising a copper foil bonded to a liquid crystal polymer, wherein the copper foil has a primary particle layer of copper on a bonding surface to the liquid crystal polymer and a secondary particle layer of a ternary alloy comprising copper, cobalt and nickel formed on the primary particle layer, the primary particle layer having an average particle size of 0.25 to 0.45 µm and the secondary particle layer having an average particle size of 0.05 to 0.25 µm.

2. The copper-clad laminate according to claim 1, wherein each of the primary particle layer and the secondary particle layer is an electroplated layer.

3. The copper-clad laminate according to claim 1, wherein the secondary particle is a dendritic particle or a plurality of dendritic particles which grows or grow on the primary particle.

4. The copper-clad laminate according to claim 1, wherein bonding strength to the liquid crystal polymer is 0.60 kg/cm or more.

5. The copper-clad laminate according to claim 1, wherein roughness Rz of the bonding surface of the copper foil to the liquid crystal polymer is 1.5 µm or less.

6. The copper-clad laminate according to claim 1, wherein roughness Rz of the bonding surface of the copper foil to the liquid crystal polymer is 1.0 µm or less.

7. The copper-clad laminate according to claim 1, wherein the copper-clad laminate is used for a high frequency printed circuit board.

8. A copper foil to be bonded to a liquid crystal polymer, wherein the copper foil has a primary particle layer of copper on a bonding surface to the liquid crystal polymer and a secondary particle layer of a ternary alloy comprising copper, cobalt and nickel formed on the primary particle layer, the primary particle layer having an average particle size of 0.25 to 0.45 µm and the secondary particle layer having an average particle size of 0.05 to 0.25 µm.

9. The copper foil according to claim 8, wherein each of the primary particle layer and the secondary particle layer is an electroplated layer.

10. The copper foil according to claim 8, wherein bonding strength to the liquid crystal polymer is 0.60 kg/cm or more.

11. The copper foil according to claim 8, wherein roughness Rz of the bonding surface of the copper foil to the liquid crystal polymer is 1.5 µm or less.

12. The copper foil according to claim 8, wherein roughness Rz of the bonding surface of the copper foil to the liquid crystal polymer is 1.0 µm or less.

13. The copper-clad laminate according to claim 1, wherein the primary particle layer has an average particle size of 0.35 to 0.45 µm.

14. The copper-clad laminate according to claim 1, wherein the secondary particle layer has an average particle size of 0.15 to 0.25 µm.

15. The copper-clad laminate according to claim 13, wherein the secondary particle layer has an average particle size of 0.15 to 0.25 µm.

16. The copper-clad laminate according to claim 1, further comprising a cobalt-nickel alloy plated layer formed as a heat resistant layer on the secondary particle layer.

17. The copper-clad laminate according to claim 1, further comprising a zinc-nickel alloy plated layer formed as a heat resistant layer on the secondary particle layer.

18. The copper-clad laminate according to claim 1, further comprising a cobalt-nickel alloy plated layer and a zinc-nickel layer formed in this order as heat resistant layers on the secondary particle layer.

19. The copper-clad laminate according to claim 16, wherein a cobalt deposition amount in the cobalt-nickel alloy plated layer is 200 to 3000 µg/dm$^2$.

20. The copper-clad laminate according to claim 16, wherein a proportion of the cobalt in the cobalt-nickel alloy plated layer is 60 to 66 mass %.

21. The copper-clad laminate according to claim 17, wherein a total amount of the zinc-nickel alloy plated layer is within the range of 150 to 500 µg/dm².

22. The copper-clad laminate according to claim 17, wherein in the zinc-nickel alloy plated layer a nickel amount is 50 µg/dm² or more, and a nickel ratio is 16 mass % to 40 mass %.

23. The copper-clad laminate according to claim 1, wherein a total cobalt deposition amount in the secondary particle layer and optionally in a cobalt-nickel alloy plated layer formed on the secondary particle layer is 300 to 4000 µg/dm².

24. The copper-clad laminate according to claim 1, wherein a total nickel deposition amount in the secondary particle layer, and optionally in a cobalt-nickel alloy plated layer and/or a zinc-nickel alloy plated layer formed on the secondary particle layer, is 150 to 1500 g/dm².

25. The copper-clad laminate according to claim 1, wherein a total cobalt deposition amount in the secondary particle layer and optionally in a cobalt-nickel alloy plated layer formed on the secondary particle layer is 300 to 3500 µg/dm².

26. The copper-clad laminate according to claim 1, wherein a total nickel deposition amount in the secondary particle layer, and optionally in a cobalt-nickel alloy plated layer and/or a zinc-nickel alloy plated layer formed on the secondary particle layer, is 150 to 1000 µg/dm².

27. The copper-clad laminate according to claim 16, having a coating treatment layer of chrome oxide alone or a mixed coating treatment layer of chrome oxide and zinc and/or zinc oxide on the heat resistant layer.

28. The copper-clad laminate according to claim 18, having a coating treatment layer of chrome oxide alone or a mixed coating treatment layer of chrome oxide and zinc and/or zinc oxide on the heat resistant layer.

29. The copper-clad laminate according to claim 28, having a silane coupling layer on the coating treatment layer of chrome oxide alone or the mixed coating treatment layer of chrome oxide and zinc and/or zinc oxide.

30. The copper-clad laminate according to claim 27, having a silane coupling layer on the coating treatment layer of chrome oxide alone or the mixed coating treatment layer of chrome oxide and zinc and/or zinc oxide.

31. A printed circuit board comprising the copper-clad laminate according to claim 1.

32. A printed circuit comprising the copper-clad laminate according to claim 1.

33. An electronic appliance comprising the printed circuit board according to claim 31.

34. The copper-clad laminate according to claim 1, wherein roughness Rz of the bonding surface of the copper foil to the liquid crystal polymer is less than 1.0 µm.

* * * * *